United States Patent
Ishida et al.

(10) Patent No.: US 7,777,316 B2
(45) Date of Patent: Aug. 17, 2010

(54) SEMICONDUCTOR DEVICE

(75) Inventors: Hiroyasu Ishida, Gunma (JP); Yasuyuki Sayama, Gunma (JP); Tetsuya Okada, Saitama (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 69 days.

(21) Appl. No.: 12/239,368

(22) Filed: Sep. 26, 2008

(65) Prior Publication Data

US 2009/0096030 A1 Apr. 16, 2009

(30) Foreign Application Priority Data

Sep. 27, 2007 (JP) .............................. 2007-252201

(51) Int. Cl.
*H01L 23/02* (2006.01)
*H01L 23/34* (2006.01)

(52) U.S. Cl. ................ 257/678; 257/368; 257/E27.081

(58) Field of Classification Search ................. 257/368, 257/170, 330, 341, E27.081, 678, 725; 438/138, 438/186, 279, 492, 758

See application file for complete search history.

(56) References Cited

U.S. PATENT DOCUMENTS 5,177,028 A * 1/1993 Manning .................... 438/289
2005/0006699 A1* 1/2005 Sato et al. .................... 257/327

FOREIGN PATENT DOCUMENTS

JP 2003-101022 4/2003
JP 2006-313892 11/2006

* cited by examiner

*Primary Examiner*—Thomas L Dickey
*Assistant Examiner*—Nikolay Yushin
(74) *Attorney, Agent, or Firm*—Morrison & Foerster LLP (57) ABSTRACT

Provided is a semiconductor device in which an insulating region surrounding an element region is provided in an end portion of a semiconductor region with a super junction structure. Since a depletion layer in the element region ends in the insulating region, the end portion of the element region is not formed in a curved surface shape. In other words, the depletion layer has no curved surface in which internal electric fields are concentrated. For this reason, there is no need to take a measure to cause the depletion layer to spread in a horizontal direction by proving a terminal region. Since the terminal region is unnecessary, a chip size can be reduced. Alternatively, an area of the element region can be expanded.

2 Claims, 6 Drawing Sheets

Prior Art

SEMICONDUCTOR DEVICE

This application claims priority from Japanese Patent Application Number JP 2007-252201 filed on Sep. 27, 2007, the content of which is incorporated herein by reference in its entirety.

BACKGROUND OF THE INVENTION

1. Field of the Invention

The present invention relates to a semiconductor device, and, in particular, to a semiconductor device reduced in area of a periphery of a semiconductor element having a super junction structure.

2. Description of the Related Art

As a silicon semiconductor wafer achieving high breakdown voltage and low on-resistance, known is, for example, a wafer structure in which pillar-like p type semiconductor layers and n type semiconductor layers are provided so as to form multiple pn junctions each being vertical to a wafer surface.

When a reverse voltage is applied, high breakdown voltage can be achieved in the pn junctions by selecting dopant concentrations and widths of the p type semiconductor layers and n type semiconductor layers to be desired values. In the following, description will be given of such a structure, which will be referred to as a super junction structure.

In a conventional semiconductor device with a super junction structure, p type semiconductor layers and n type semiconductor layers are alternately arranged not only in an element region but also in a terminal region around the element region, to secure certain breakdown voltage. This technology is described for instance in Japanese Patent Application Publications No. 2006-313892 (FIG. 1 on page 9 thereof) and No. 2003-101022 (FIG. 15 on page 9 thereof)).

As one example of such a conventional semiconductor device, a MOSFET with a super junction structure will be described by referring to FIG. 6.

Figure 6:
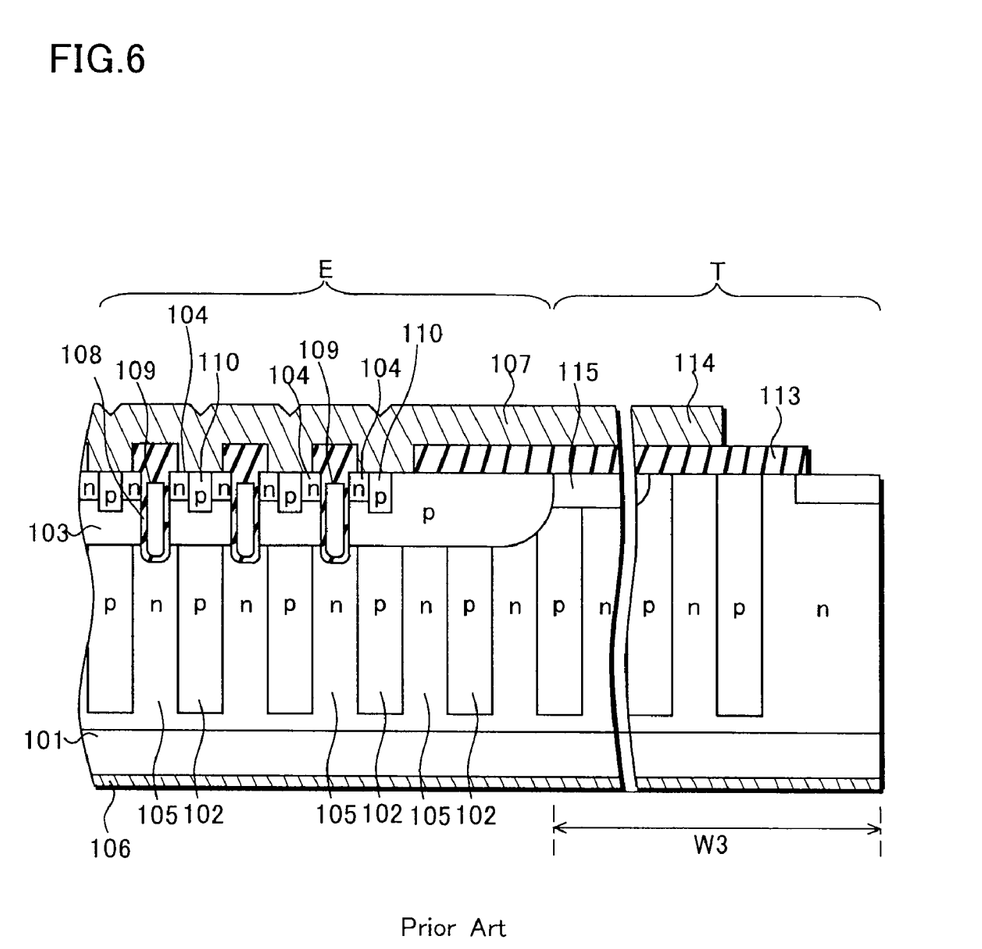
FIG. 6 is a cross-sectional view for illustrating a conventional semiconductor device.

FIG. 6 is a cross-sectional view around a periphery of the MOSFET. This MOSFET has a super junction structure in which p type semiconductor layers 102 and n type semiconductor layers 105 are alternately arranged on an n+ type semiconductor substrate 101. In addition, an element region E of the MOSFET is provided on a top surface of the super junction structure.

In the element region E, a p type base layer 103 is provided in top surfaces of the pillar-like p type semiconductor layers 102 and n type semiconductor layers 105, and gate electrodes 109 are each provided in the p type base layer 103 with a gate insulating film 108 interposed in between, the gate electrodes 109 being deep enough to penetrate the p type base layer 103. N type source diffusion layers 104 are provided in the surface of the p type base layer 103, and a source electrode 107 is provided on the p type base layer 103 and the n type source diffusion layers 104. In addition, p type contact layers 110 are provided between the p type base layer 103 and the source electrode 107.

In FIG. 6, in a region in which MOSFET is formed, more specifically, for example, a region up to an end portion of the p type base layer 103 is set to be an element region E and a region from a circumference of the element region E up to an end portion of the n+ substrate 101 (chip) is set to be a terminal region T, the p type semiconductor layers 102 and the n type semiconductor layers 105 are arranged up to the terminal region T in order to improve breakdown voltage.

In addition, a field plate electrode 114 is provided on the n type semiconductor layers 105 and p type semiconductor layers 102, with an insulating film 113 interposed in between, in the terminal region T. The field plate electrode 114 is connected to the source electrode 107 or the gate electrodes 109, and has an effect of increasing breakdown voltage in cooperation with a p type RESURF (REduced SURface Field) layer 115 provided in an end portion of the p type base layer 103.

In general, in a depletion layer formed in a junction surface between an n type impurity semiconductor layer and a p type impurity semiconductor layer, an internal electric field in the direction from the n type to the p type is formed. Accordingly, in a case where an end portion of the depletion layer is formed in a curved surface shape having a certain curvature, the internal electric field of the depletion layer concentrates around the curved surface. As the curvature of the curved surface is larger, the concentration of the internal electric field is more intensified. Thus, the curvature in the end portion of the depletion layer is needed to be reduced by expanding the depletion layer in a horizontal direction of the substrate.

In order to achieve a super junction structure formed of p type semiconductor layers and n type semiconductor layers, dopant concentrations of the p type semiconductor layer and the n type semiconductor layer have to be sufficiently increased. Since a depletion layer formed in an end portion of an element region E has an extremely large curvature, needed is a configuration in which the curvature of the depletion layer is reduced in the end portion of the element region or in a terminal region around the element region so that sufficient breakdown voltage is secured.

For example, in FIG. 6, the concentration of the internal electric field is reduced by expanding the depletion layer in the horizontal direction of the substrate (a direction parallel to the substrate surface) by using the p type RESURF layer 115 and the field plate electrode 114. In addition, the p type semiconductor layers 102 and the n type semiconductor layers 105 are also provided in the terminal region T. Thereby, sufficient breakdown voltage is secured.

In the case of FIG. 6, the p type semiconductor layers 102 and the n type semiconductor layers 105 in the terminal region T are affected by a voltage applied to the element region E. Thus, the depletion layer sufficiently spreads in the region close to the element region E while spreads less when it comes closer to an end portion.

Accordingly, in the structure, the depletion layer gradually spreads less as it comes closer to the end portion. Thus, at the same time as reduction in curvature by expanding the depletion layer in the horizontal direction of the substrate, reduction in the concentration of the electric field in the end portion of the depletion layer can be achieved by using a guard ring (RESURF layer) or the like.

In other words, not only in a MOSFET, but also in a semiconductor device with a super junction structure, breakdown voltage is generally secured by proving p type semiconductor regions and n type semiconductor regions in the terminal region. From a viewpoint of securing breakdown voltage, the terminal region larger in width is more desirable.

However, even in a case where an area of the element region E is the same, when a number of p type semiconductor layers and n type semiconductor layers are formed in the terminal region, a chip size becomes larger. For example, when compared with a MOSFET not having a super junction structure, that is, a MOSFET in which an element region is formed in an n type semiconductor layer, the MOSFET with a super junction structure becomes larger in chip size, and a yield of chips per wafer is consequently decreased, even if the area of element region and characteristics are the same as those of the MOSFET not having the super junction structure.

A wafer with a super junction structure tends to be costly because a manufacturing process thereof is complicated. Moreover, the smaller yield of chips per wafer causes a problem of further increasing the manufacturing cost.

By contrast, when an increase of the chip size is suppressed, an area of an element region decreases, which leads to an increase in on-resistance in the case of a MOSFET.

SUMMARY OF THE INVENTION

The invention provides a semiconductor device that includes a semiconductor substrate of a first general conductivity type, a plurality of first semiconductor layers of the first general conductivity type standing on the semiconductor substrate, a plurality of second semiconductor layers of a second general conductivity type standing on the semiconductor substrate so that each of the second semiconductor layers forms a pn junction perpendicular to the semiconductor substrate with a corresponding first semiconductor layer, a plurality of transistors formed on the first and second semiconductor layers, and an insulating layer standing on the semiconductor substrate and surrounding the first and second semiconductor layers so as to define a sidewall of the semiconductor device.

DESCRIPTION OF THE INVENTION

By referring to FIGS. 1A, 1B, 2, 3A, 3B, 3C, 4A, 4B, 4C, 5A and 5B, a preferred embodiment of the present invention will be described in details by using, as an example, a case where MOSFET is formed in an element region.

Figure 1A:
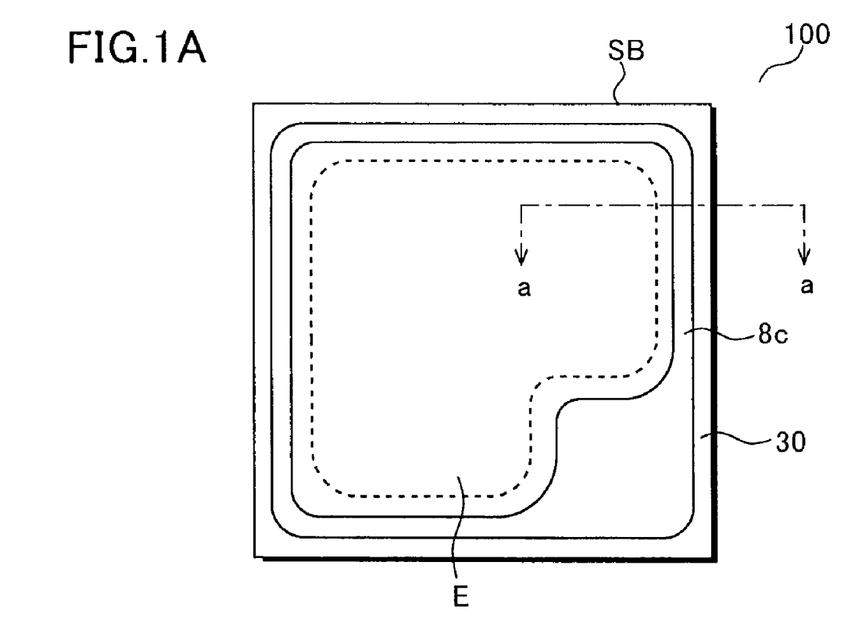
FIGS. 1A and 1B are respectively a plan view and a cross-sectional view, each for illustrating a semiconductor device according to one embodiment of the present invention.
Figure 1B:
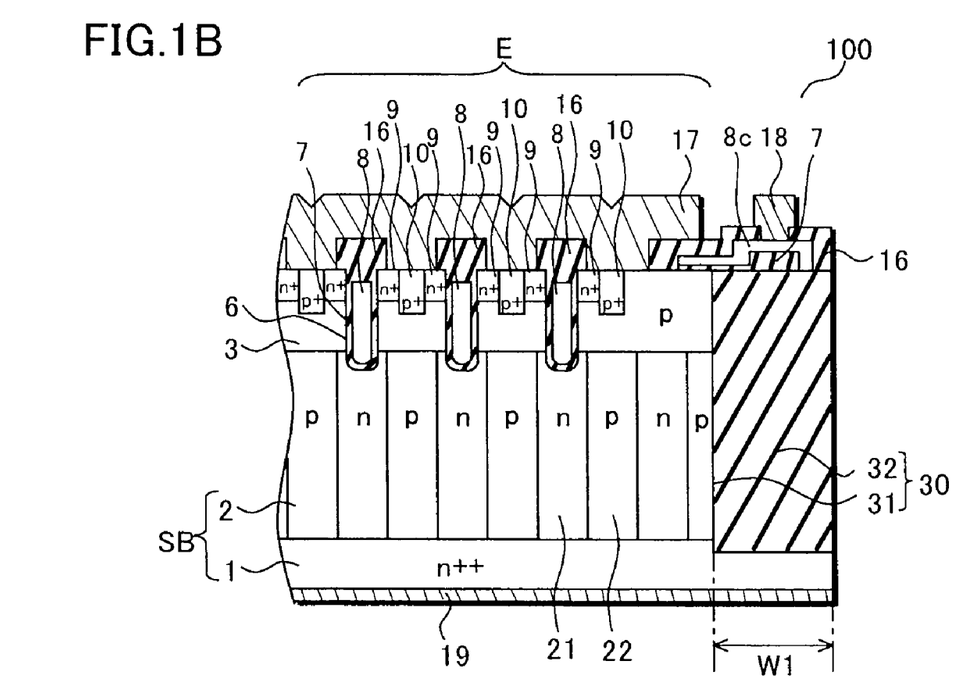

FIGS. 1A and 1B show a MOSFET 100 according to the present embodiment. Specifically, FIG. 1A is a plan view and FIG. 1B is a cross-sectional view taken along the a-a line in FIG. 1A. Note that a metal electrode and insulating film, which are formed on the surface of the MOSFET 100, are not shown in FIG. 1A.

The MOSFET 100 according to the preferred embodiment of the present invention includes one-conductivity-type semiconductor substrate 1, a semiconductor region 2, an element region E, and an insulating region 30.

As shown in FIG. 1A, the element region E of the MOSFET is provided, as shown by the broken line, on the surface of a substrate SB in which a semiconductor region is provided on the one-conductivity-type semiconductor substrate. The insulating region 30 is provided in a circumference of the element region E and a circumferential end of the insulating region 30 corresponds to an end portion of the substrate SB.

The detailed illustration is not given here, but a gate electrode in the element region E is extracted to a periphery of the substrate SB and is connected to a gate extraction portion 8c formed of a polysilicon layer which is same as the gate electrode. The gate extraction portion 8c is connected to a gate wiring (unillustrated) provided thereon and the gate wiring is connected to, for example, a gate pad electrode (unillustrated) provided in one portion of a chip corner.

As shown in FIG. 1B, the one-conductivity-type semiconductor substrate 1 is, for example, a high-concentration n type (n+ type) silicon semiconductor substrate.

The semiconductor region 2 is a semiconductor region with a super junction structure provided on the n+ type silicon semiconductor substrate 1. The super junction structure means here a structure in which n type semiconductor layers 21 and p type semiconductor layers 22 are alternately provided so as to come into contact with each other so that multiple pn junctions are formed in the vertical direction to the surface of the n+ type silicon semiconductor substrate 1. Note that it is also possible that the n type semiconductor layers 21 are formed on bottom portions of the p type semiconductor layers 22. Also note that conductivity types such as n+, n and n− belong in one general conductivity type and conductivity types such as p+, p and p− belong in another general conductivity type.

The element region E is a region in which a transistor cell and the like are formed by performing desired impurity diffusion or other operations on the surface of the semiconductor region 2. In the present embodiment, a cell of insulating gate type semiconductor element (MOSFET) is formed as one example.

The configuration of MOSFET is as follows.

A semiconductor region 2 with a super junction structure is provided on an n+ type silicon semiconductor substrate 1. A drain region is formed by the n+ type silicon semiconductor substrate 1 and n type semiconductor layers 21 in the semiconductor region 2.

A channel layer 3 is a p type impurity region provided on the surface of the semiconductor region 2. A trench 6 is provided being deep enough to reach the n type semiconductor layer 21 penetrating the channel layer 3. In addition, an inner wall of the trench 6 is covered with a gate insulating film (for example, an oxide film) 7 with a thickness corresponding to a driving voltage.

A gate electrode 8 is buried in the trench 6. The gate electrode 8 is, for example, a polysilicon layer into which an impurity (for example, phosphorus (P)) is doped.

Source regions 9, which are high-concentration n type impurity regions, are provided on the surface of the channel layer 3 adjacent to trenches 6, and body regions 10, which are high-concentration p type impurity regions, are provided on the surface of the channel layer 3 between the adjacent source regions 9. The source regions 9 are adjacent to the gate electrodes 8 with the gate insulating film 7 interposed in between. A region surrounded by the trench 6 becomes one MOSFET cell.

An interlayer insulating film 16 is provided so as to cover at least the gate electrode 8. A source electrode 17 is formed of Al or the like and generally contains silicon for spike prevention. In addition, the source electrode 17 is a metal electrode layer which is patterned in a desired wiring form and comes in contact with the source regions 9 and the body regions 10 through a contact hole between the interlayer insulating films 16.

A gate extraction portion 8c to be connected to the gate electrode 8 extends on the surface of the substrate SB in the periphery of the element region E. A gate wiring 18 which is superimposed thereon and a gate pad electrode (unillustrated) connected to the gate wiring 18 are formed of the same metal layer as that of the source electrode 17. In addition, a drain electrode 19 is provided on the back surface of the substrate SB.

An insulating region 30 is formed of a recessed portion 31 and an insulating film 32 which is provided on at least an inner wall of the recessed portion 31. In the present embodiment, for example, the insulating film 32 is buried in the recessed portion 31. As the insulating film 32, a thermal oxidation film may be formed. In addition, after the thermal oxidation film is formed, an insulating film, such as a tetraethylorthosilicate (TEOS) film or a nitride film, may be buried or an insulating resin layer, such as a polyimide film, may be buried. Or, the thermal oxidation film is not needed to be formed.

The insulating region 30 is provided so as to surround the circumference in the element region E. The insulating region 30 is deep enough to reach the semiconductor substrate 1 penetrating from the surface of the semiconductor region 2. In addition, the insulating region 30 is provided in an end portion of the semiconductor region 2 so that a side surface of the end portion would be exposed. If the insulating region 30 is buried, a circumferential end of the insulating region 30 corresponds to a circumferential end of the substrate SB.

In the present embodiment, the element region E is assumed to be up to a region where the channel layer 3 is arranged. In other words, the insulating region 30 comes in contact with the end portion of the element region E.

Figure 2:
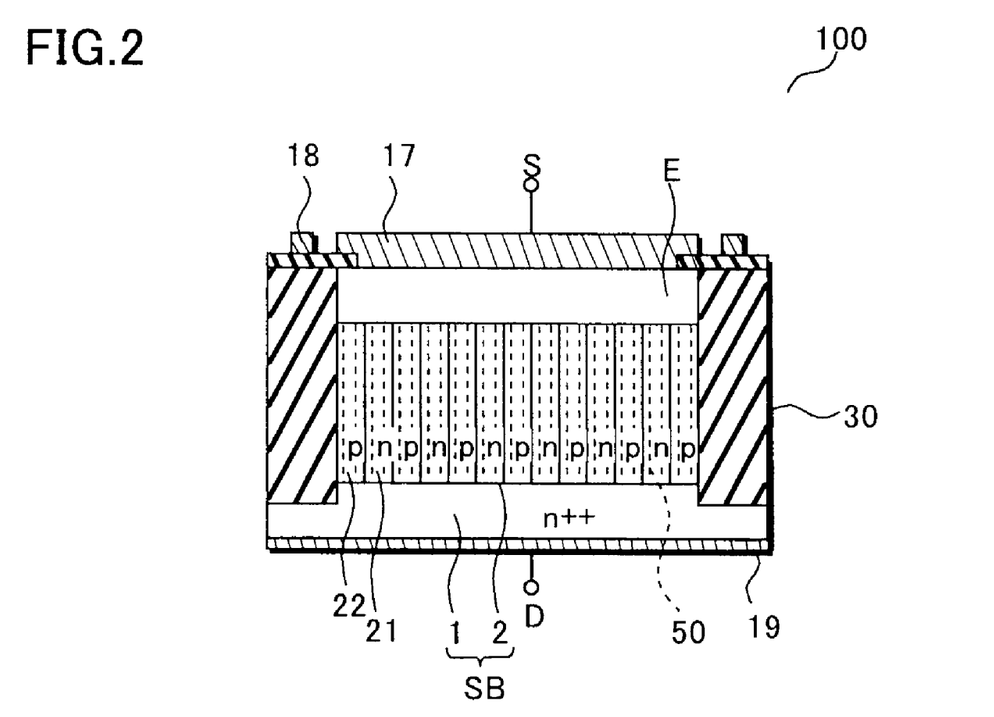
FIG. 2 is a schematic view for illustrating the semiconductor device according to one embodiment of the present invention.

FIG. 2 is a schematic view showing a state of depletion layers 50 how they spread when a reverse voltage is applied to the MOSFET 100 according to the present embodiment. Note that the detail of the MOSFET in the element region E is not described.

The semiconductor region 2 has a super junction structure. When a reverse voltage is applied, the depletion layer 50 spreads in the vertical direction of the substrate SB (in the vertical direction to the surface of the substrate SB) in each of the n type semiconductor regions 21 and the p type semiconductor regions 22. Then, after the entire semiconductor region 2 is depleted, breakdown voltage is secured until it reaches a critical field strength.

At this time, the depletion layer 50 is ended by the insulating region 30 provided in the end portion of the element region E. In other words, the depletion layer 50 is formed with its end portion not being in a curved surface shape.

As described above, a curved surface in which inner fields are concentrated is not present in the end portion of the depletion layer 50. Thereby, it is not needed, like a conventional case, to arrange a number of p type semiconductor layers 102 and n type semiconductor layers 105 in a terminal region T or to arrange a field plate electrode 114, a RESURF region 115, and the like so as to reduce curvature of the depletion layer.

In other words, the terminal region T required in the conventional structure (FIG. 6) is no longer necessary. Thereby, a chip size can be reduced for that. For example, as one example, in the case of a semiconductor chip (chip size is, for example, 2 square mm) having a super junction structure with the breakdown voltage of 600V in the conventional structure (FIG. 6), a width W3 of the terminal region T (width from the end portion of the element region E to the terminal region T) is required to be approximately 250 μm. However, in the present embodiment, a width W1 of the insulating region 30 surrounding the circumference of the element region E (see, FIG. 1B) is only required to be approximately 100 μm. Thereby, the chip size can be reduced by approximately 30%.

If the chip size is maintained to be equivalent to a conventional size, an area of the element region E can be expanded. Thereby, on-resistance can be reduced in the case of MOSFET.

Next, by referring to FIGS. 3A, 3B, 3C, 4A, 4B and 4C, a method for manufacturing the insulating region 30 according to the present embodiment will be described as an example.

Figure 3A:
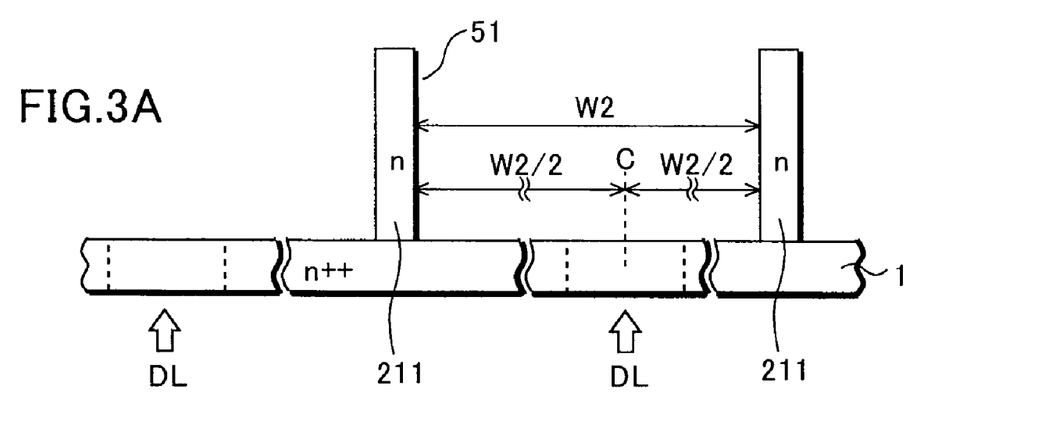
FIGS. 3A to 3C are cross-sectional views for illustrating a method for manufacturing a semiconductor device according to one embodiment of the present invention.
Figure 3B:
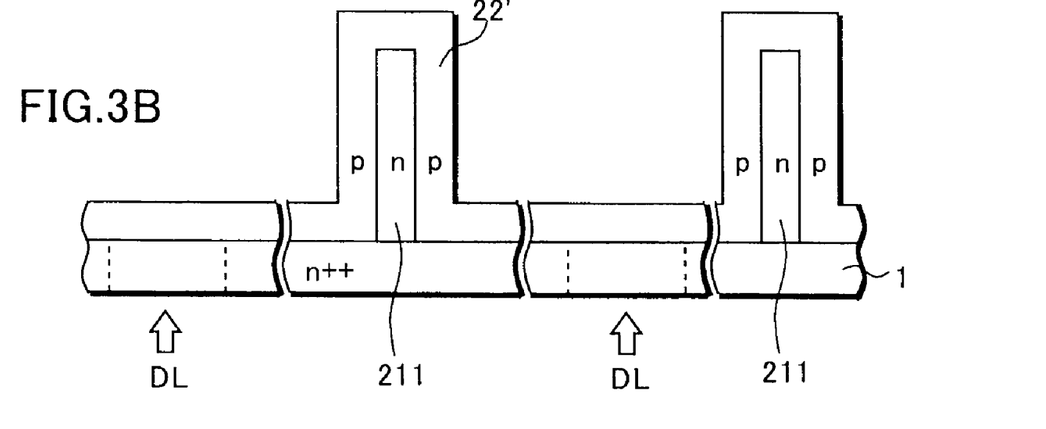

In the MOSFET according to the present embodiment, the insulating region 30 whose side surface is exposed is provided in the end portion of the semiconductor region with the super junction structure. This can be formed as follows.

As shown in FIG. 3A, an n type epitaxial layer is stacked on an n++ type silicon semiconductor substrate 1 with a desired thickness. Then, trenches 51 keeping a desired distance away from each other are formed and n type semiconductor layers 211 are formed. An opening width W2 of the trench 51 is adjusted so that the center C thereof is positioned above a dicing line DL. Note that, the n type epitaxial layer may remain on the bottom portion of the trench 51.

Figure 3C:
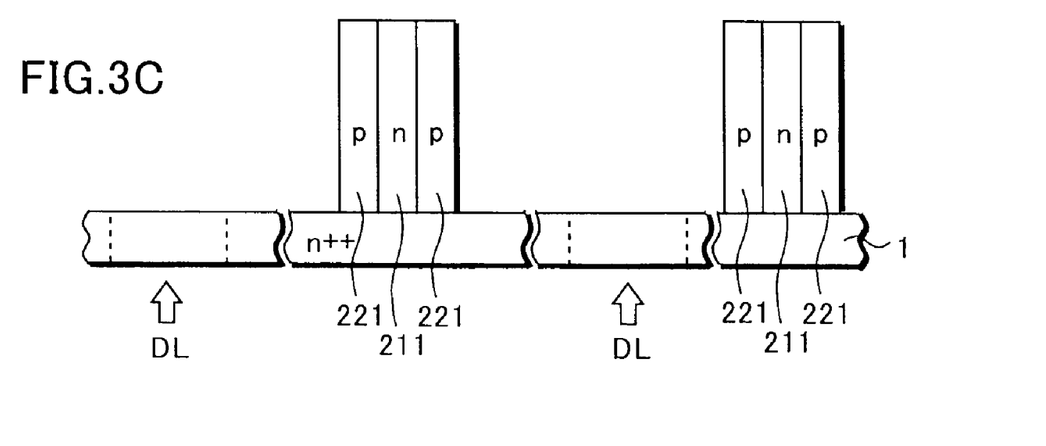

Subsequently, a p type epitaxial layer 22' is stacked on the entire surface with a desired thickness (FIG. 3B) and a p type semiconductor layer 211 adjacent to the n type semiconductor layer 221 is formed by the overall anisotropic etching (FIG. 3C). Thereafter, this step of forming an epitaxial layer and a step of performing overall anisotropic etching will be repeated at least once. Thereby, the n type semiconductor layer 21 and the p type semiconductor layer 22, which are all formed of epitaxial layers, are alternately formed so as to be adjacent to each other.

The n type semiconductor layer 21 and the p type semiconductor layer 22 are all epitaxial layers and can be formed with desired thicknesses (widths).

Figure 4A:
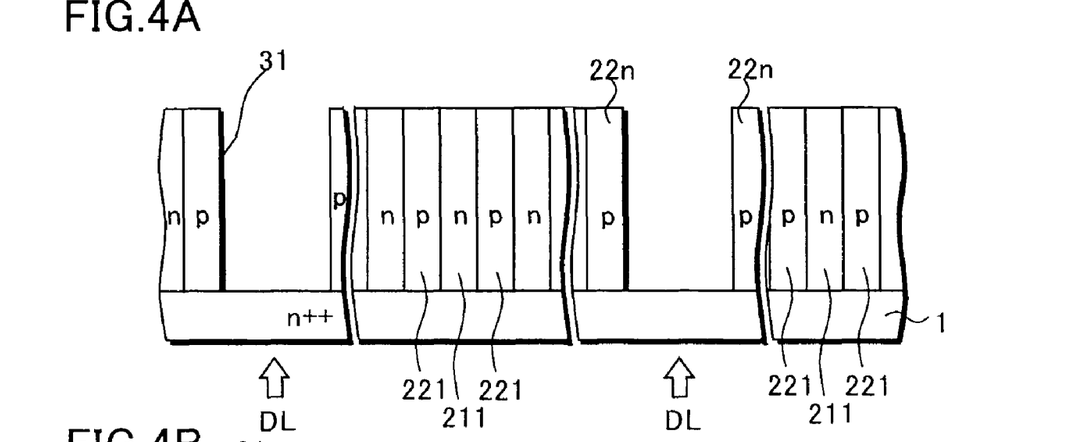
FIGS. 4A to 4C are cross-sectional views for illustrating the method for manufacturing a semiconductor device according to one embodiment of the present invention.

FIG. 4 is a cross-sectional view after the steps of forming the last (n-th) epitaxial layer and performing the overall anisotropic etching, and an n-th p type semiconductor layer 22n is formed. Multiple n type semiconductor layers 21 and p type semiconductor layers 22 are formed in the initially formed trenches 51. In addition, only the recessed portion 31 with a desired width is left above the dicing line DL (FIG. 4A).

Figure 4B:
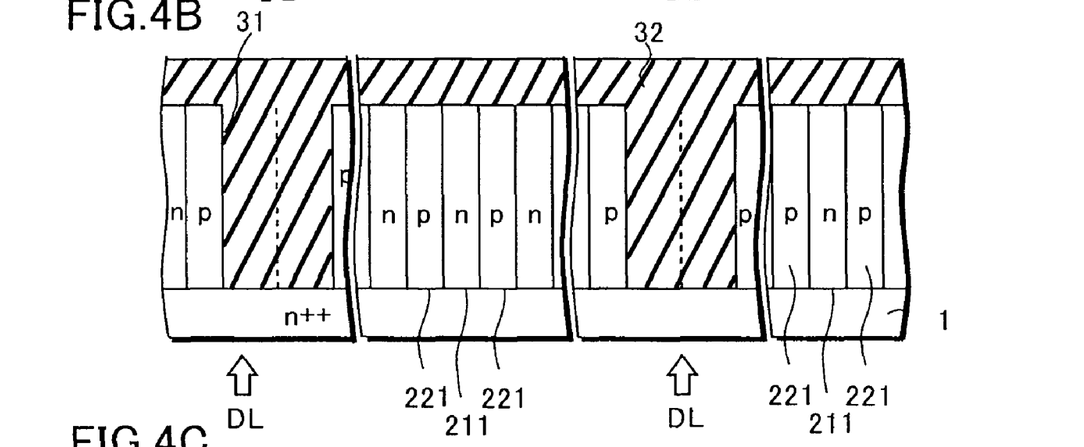

For example, the insulating film 32 is buried in the recessed portion by forming the insulating film 32 on the entire surface. The recessed portion 31 may be all formed of a thermal oxidation film. Alternatively, an insulating film, such as a TEOS film or a nitride film, may be buried or an insulating resin layer, such as a polyimide film, may be buried after the thermal oxidation film is formed (FIG. 4B). Or, the thermal oxidation film is not needed to be formed.

Figure 4C:
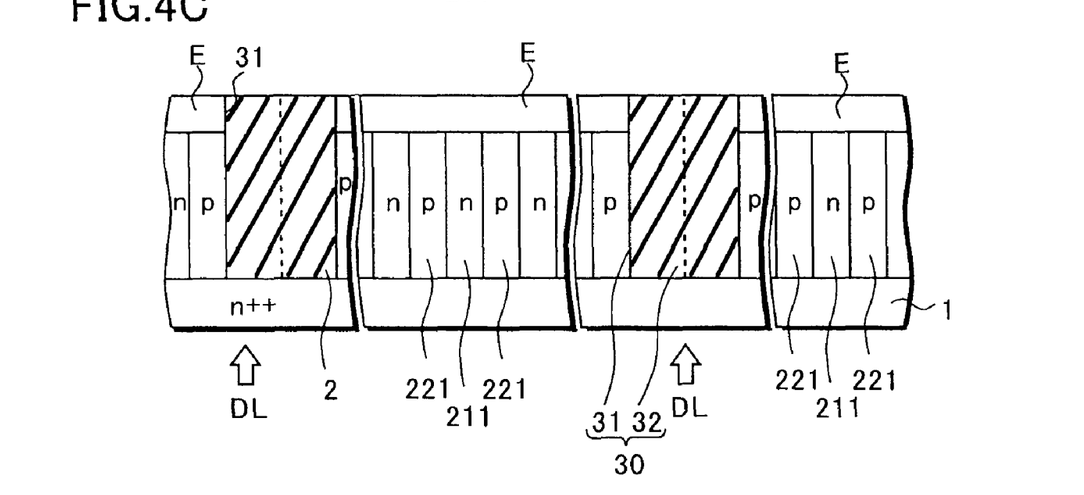

Thereafter, the insulating film 32 on the surface is removed by the etching to form the semiconductor region 2 with the super junction structure. Then, a desired element region E (MOSFET here) is formed on the surface (FIG. 4C).

Thereafter, dicing is performed to divide the semiconductor region 2 into individual semiconductor chips for each element region E. In each semiconductor chip, the insulating region 30 is provided in the end portion of the semiconductor region 2 and the side surface thereof is exposed to the end portion of the substrate SB (semiconductor chip). In addition, the width W2 of the initial trench 51 is determined by considering: the widths of the n type semiconductor layer 21 and the p type semiconductor layer 22; and the position of the dicing line DL (chip size). Thus, the semiconductor region 2 with the super junction structure in which the inside of the insulating region 30 is all formed of epitaxial layers can be formed.

When the insulating film is formed in the recessed portion 31 as shown in FIG. 4B, a void is likely formed in a vicinity of the center of the recessed portion 31 or a defect may be caused in which the insulating films formed from the both sides do not preferably join in the center thereof. However, using the above-described method in which the insulating region 30 is formed to be positioned above the dicing line, the insulating region 30 in the defected portions can be removed by dicing after a desired element region is formed in the semiconductor wafer 10. Thus, characteristics of individual semiconductor devices (MOSFET chips) are not affected.

Specifically, the center C of the opening width W2 of the trench 51 is arranged to be positioned above the dicing line DL (FIG. 3A). Thereby, the region in which the insulating region 30 is formed can be superimposed on the dicing line.

In this case, in all the regions to be semiconductor chips, the p type semiconductor layers and n type semiconductor layers which together form a super junction are arranged. Thus, the step of forming another epitaxial layer and the step of etching are repeated after the third semiconductor layer is formed as described above, so that the p type semiconductor layers 22 and the n type semiconductor layers 21 are alternately formed so as to be adjacent to each other.

Next, another embodiment will be described by referring to FIGS. 5A and 5B.

Figure 5A:
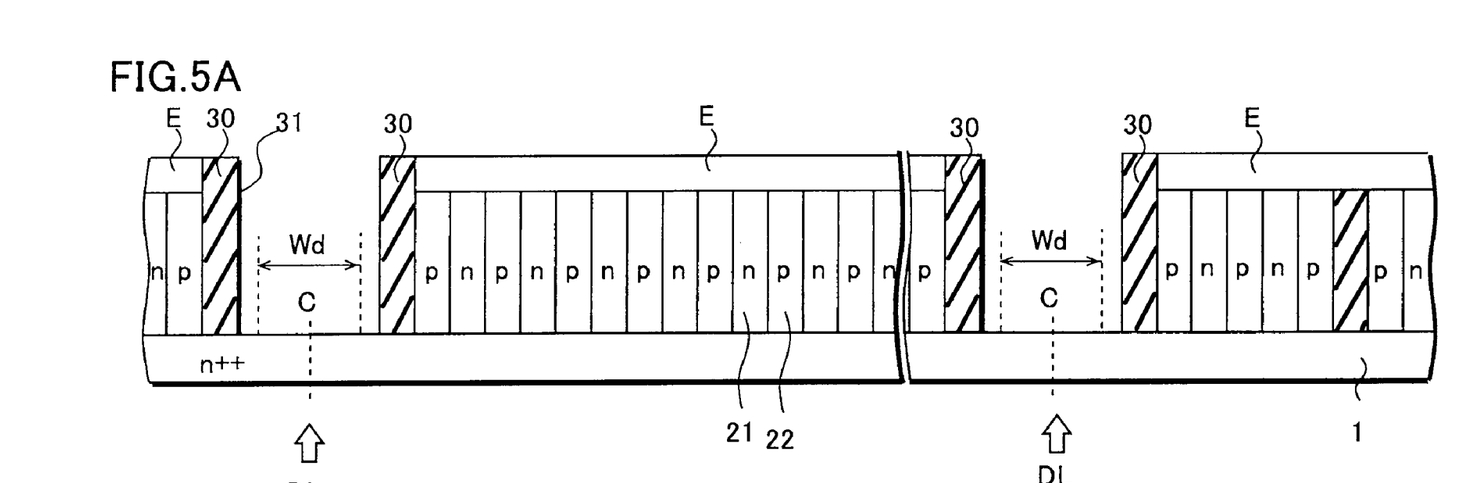
FIGS. 5A and 5B are cross-sectional views for illustrating the method for manufacturing a semiconductor device according to one embodiment of the present invention.
Figure 5B:
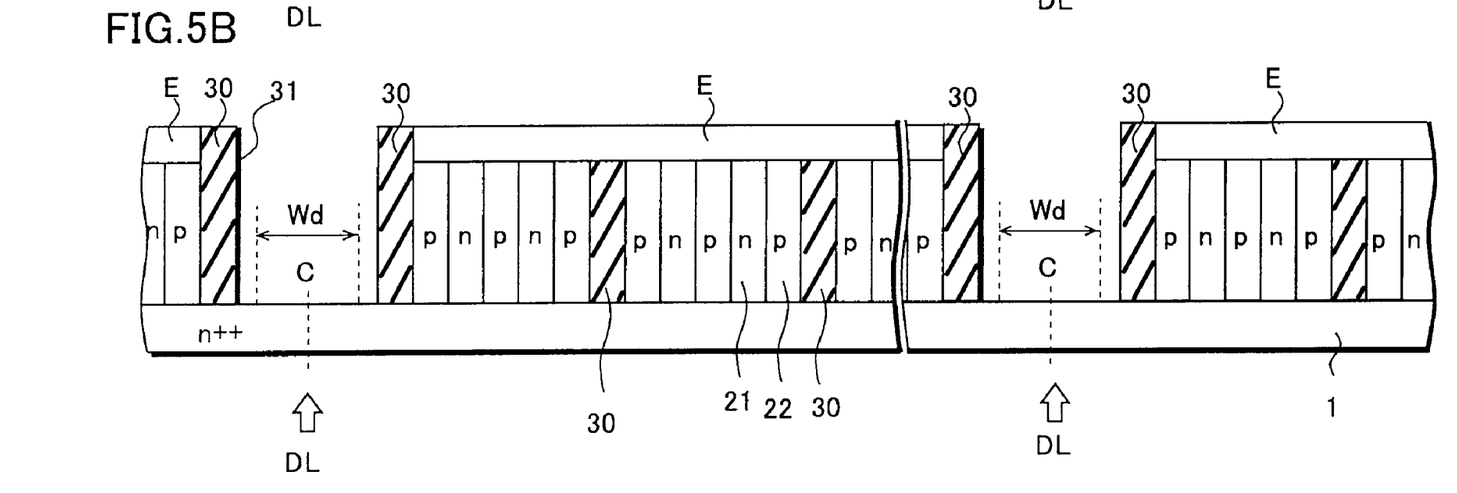

FIGS. 5A and 5B show a state where an insulating film 32 is not completely buried in a recessed portion 31 and an insulating region 30 is formed only on a side surface of the recessed portion 31.

The description is made referring to FIG. 5A. FIG. 5A is similar to FIGS. 4A to 4C in that the center C of an opening width W2 of a trench 51 is arranged to be positioned above a dicing line DL. However, the dicing line DL has a wider width in reality. For this reason, the insulating region 30 is provided by leaving a dicing blade width Wd. In other words, the insulating region 30 which is adjacent to, for example, the p type semiconductor layer 22 exposed to the side surface of the recessed portion 31 and has, for example, an equivalent width with the p type semiconductor layer 22.

In this case, in all the regions to be semiconductor chips, the p type semiconductor layer and the n type semiconductor layer which together form a super junction are arranged. For this reason, the formation and etching of the p type epitaxial layer and the formation and etching of the n type epitaxial layer are repeated as described above. Thereby, the p type semiconductor layers 22 and the n type semiconductor layers 21 are alternately arranged so as to be adjacent to each other.

With this structure, the dicing is performed on the region where the insulating film 32 is not formed between the insulating regions 30 (bottom portion of the recessed portion 31). Thus, deterioration of the dicing blade can be suppressed.

Furthermore, as shown in FIG. 5B, the insulating region 30 may be arranged in the regions to be semiconductor chips.

In other words, FIG. 5A shows a structure in which all the lower portions of the element region E have a super junction structure, while FIG. 5B shows that the insulating regions 30 are arranged, at regular interval, with a width approximately same as the width of the n type semiconductor layer 21 or the p type semiconductor layer 22 in the lower portion of the element region E. In the lower portion of the element region E, the n type semiconductor layer 21, the p type semiconductor layer 22, and the insulating region 30 come in contact with one another. Above the dicing line DL, the width W2 of the trench 51, the widths of the n type semiconductor layer 21, the p type semiconductor layer 22, and the insulating region 30 are appropriately determined so that the insulating region 30 would be formed by leaving the width Wd of the dicing blade. Thereby, the insulating film 32 is not formed in the region of the width Wd of the dicing blade and the insulating region 30 adjacent to the p type semiconductor layer 22 (or n type semiconductor layer 21) is provided.

In this case as well, the dicing can be performed on the region where the insulating film (insulating region 30) 32 does not exist. Thus, the deterioration of the dicing blade can be prevented.

According to the preferred embodiment of the present invention, the end portion of the depletion layer which spreads when a reverse voltage is applied is not formed in a curved surface shape. Thus, the concentration of internal electric fields is not caused in the end portion of the depletion layer. If the end portion of the depletion layer has a curved surface shape with a certain curvature, internal electric fields concentrate around the curved surface. Thus, there is a need to take a measure to cause the depletion layer to sufficiently spread in the horizontal direction of the substrate in the terminal region. However, in the present embodiment, the end portion of the depletion layer does not have a curved surface shape. Thus, the structure for avoiding the concentration of internal electric fields at the end portion of the depletion layer is unnecessary.

In other words, even in the case of the semiconductor device with the super junction structure, a number of p type semiconductor regions and n type semiconductor regions are not needed to be arranged in the outside of the element region. Moreover, means of reducing curvature in the end portion of the depletion layer, such as a guard ring or the like, is also unnecessary.

Accordingly, the chip size can be greatly reduced, and thus the cost of the semiconductor chip can be reduced. For example, in a case of a semiconductor chip with a super junction structure having breakdown voltage of 600V, a width from one end portion of an element region is conventionally required to be approximately 250 μm as a terminal region in which p type semiconductor regions, n type semiconductor regions, guard rings, and the like are arranged. For this reason, a semiconductor chip with 2 mm$^2$ is used. However, in the present embodiment, only the width of the insulating region surrounding the circumference of the element region (i.e. approximately 100 μm) is required to be secured. As a result, the chip size can be reduced by approximately 30%.

In addition, compared with a semiconductor device with the conventional super junction structure having the same chip area and breakdown voltage, the semiconductor device according to the present invention can have an expanded area of the element region. Thus, on-resistance can be reduced in the case of a MOSFET, for example.

What is claimed is:

1. A semiconductor device comprising:
   a semiconductor substrate of a first general conductivity type;
   a plurality of first semiconductor layers of the first general conductivity type standing on the semiconductor substrate;
   a plurality of second semiconductor layers of a second general conductivity type standing on the semiconductor substrate so that each of the second semiconductor layers forms a pn junction perpendicular to the semiconductor substrate with a corresponding first semiconductor layer;
   a plurality of transistors formed on the first and second semiconductor layers; and
   an insulating layer standing on an outermost peripheral portion of the semiconductor substrate and surrounding the first and second semiconductor layers so as to define a sidewall of the semiconductor device.

2. The semiconductor device of claim 1, wherein the transistors comprise insulating gate type transistors.

* * * * *